(12) United States Patent
Buchhold

(10) Patent No.: US 7,030,601 B2
(45) Date of Patent: Apr. 18, 2006

(54) CIRCUIT CONFIGURATION FOR A GRADOMETRIC CURRENT SENSOR WITH A BRIDGE CIRCUIT FOR MEASURING GRADIENTS OF MAGNETIC FIELD STRENGTH AND A SENSOR EQUIPPED WITH THIS CIRCUIT CONFIGURATION

(75) Inventor: Reinhard Buchhold, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/489,122

(22) PCT Filed: Sep. 11, 2002

(86) PCT No.: PCT/IB02/03762

§ 371 (c)(1),
(2), (4) Date: Mar. 10, 2004

(87) PCT Pub. No.: WO03/025604

PCT Pub. Date: Mar. 27, 2003

(65) Prior Publication Data

US 2004/0239322 A1 Dec. 2, 2004

(30) Foreign Application Priority Data

Sep. 15, 2001 (DE) ................ 101 45 655

(51) Int. Cl.
*G01R 31/02* (2006.01)

(52) U.S. Cl. .................... 324/117 R; 324/126

(58) Field of Classification Search ............ 324/117 R, 324/117 H, 251–252, 207.12, 207, 126–127; 338/32 R, 32 H
See application file for complete search history.

(56) References Cited

U.S. PATENT DOCUMENTS

| | | | | |
|---|---|---|---|---|
| 4,441,072 | A | * | 4/1984 | Rahman ...................... 323/368 |
| 4,596,950 | A | * | 6/1986 | Lienhard et al. ......... 324/117 R |
| 5,621,377 | A | * | 4/1997 | Dettmann et al. ......... 338/32 R |
| 5,933,003 | A | * | 8/1999 | Hebing et al. .......... 324/117 R |
| 6,433,545 | B1 | * | 8/2002 | Kunze et al. ................ 324/252 |

FOREIGN PATENT DOCUMENTS

EP 0607595 A2 7/1994

* cited by examiner

*Primary Examiner*—Vinh P. Nguyen

(57) ABSTRACT

In order to create a circuit configuration for a gradiometric current sensor with a bridge circuit in the form of a Wheatstone bridge for measuring gradients of the magnetic field strength of a current-carrying conductor, with four magnetoresistive resistors, two of which resistors form a sub-bridge in each case, while the sub-bridges are arranged symmetrically in relation to sub-conductors of the current-carrying conductor, and with a compensating circuit associated with the bridge circuit, which compensating circuit comprises compensating conductors associated with the magnetoresistive resistors, to which compensating conductors a compensating current can be applied, by means of which circuit configuration mounting tolerances can be compensated in a simple manner, it is provided that the sub-bridges (22, 24) can each have a separate compensating current ($I_{comp1}$, $I_{comp2}$) applied to them.

4 Claims, 1 Drawing Sheet

Figure 1:
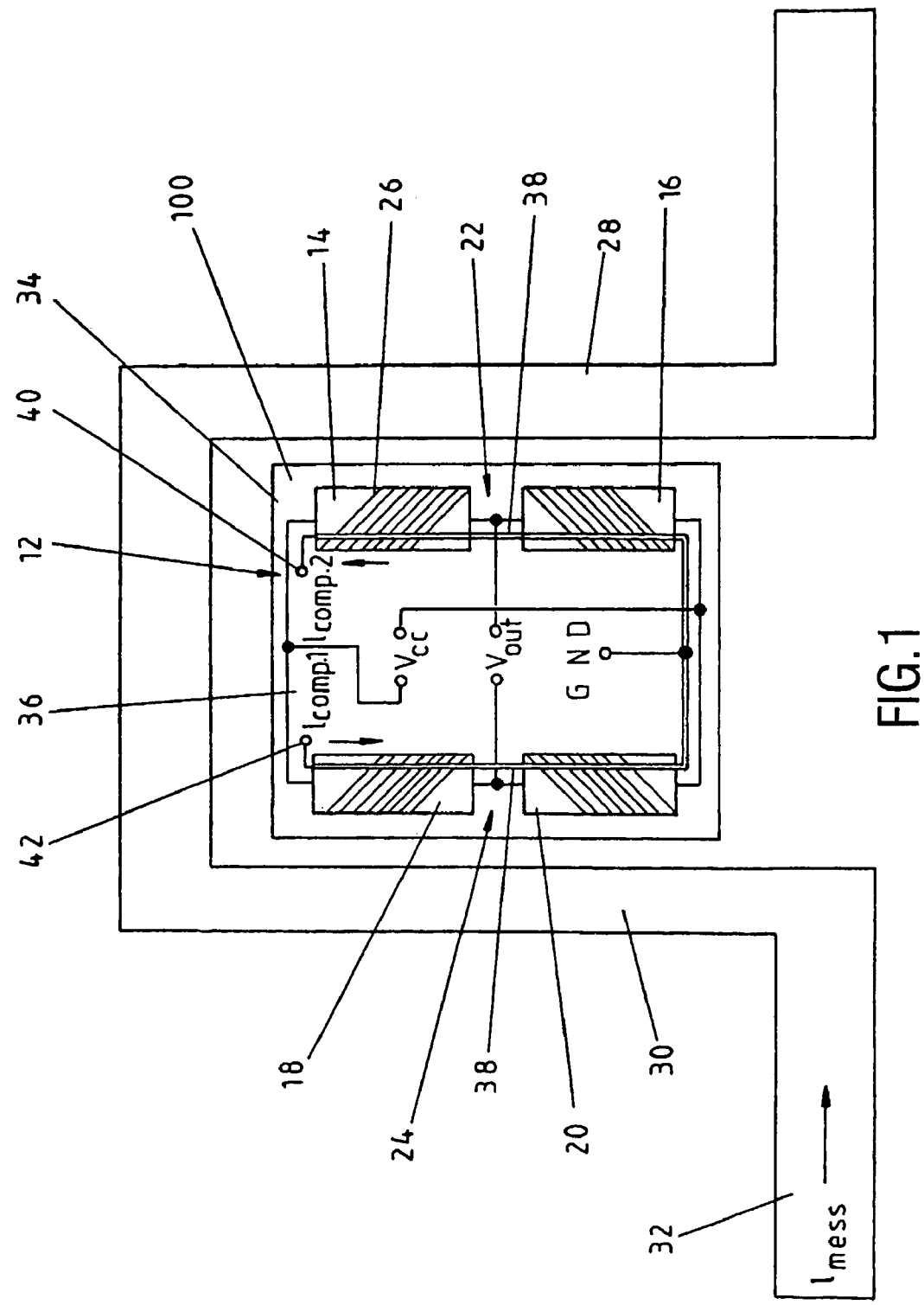

CIRCUIT CONFIGURATION FOR A GRADOMETRIC CURRENT SENSOR WITH A BRIDGE CIRCUIT FOR MEASURING GRADIENTS OF MAGNETIC FIELD STRENGTH AND A SENSOR EQUIPPED WITH THIS CIRCUIT CONFIGURATION

This Application is a 371 of PCT/IB02/03762 filed on Sep. 11, 2002.

The invention relates to a circuit configuration for a gradiometric current sensor with a bridge circuit in the form of a Wheatstone bridge for measuring gradients of the magnetic field strength of a current-carrying conductor, with four magnetoresistive resistors, two of which resistors form a sub-bridge in each case, whereby the sub-bridges are arranged symmetrically in relation to sub-conductors of the current-carrying conductor, and with a compensating circuit associated with the bridge circuit, which compensating circuit comprises conductors associated with the magnetoresistive sub-bridges, to which conductors a compensating current can be applied.

Circuit configurations of the same generic type are known. For example, EP 0607595 A2 describes a sensor chip with magnetoresistive resistors connected in the form of a Wheatstone bridge. Here, the magnetoresistive resistors are arranged in parallel and symmetrically in relation to a theoretical central axis, while the bridge arms of the Wheatstone bridge are each equipped with a magnetoresistive resistor on either side of the theoretical central axis.

On the magnetoresistive resistors, thin-film strip conductors isolated from the latter are provided, to which thin-film strip conductors a compensating current which compensates the magnetic fields generated by the current to be measured can be applied. It is achieved by means of a known circuit configuration of this kind that a current flowing through the current-carrying conductor to be monitored can be measured in a floating manner. Using the bridge arms of the Wheatstone bridge, magnetic-field gradients proportional to the current, which arise as a result of the current flow, are measured compensatively. Owing to the symmetrical arrangement of the sub-bridges, external interfering magnetic fields have no effect on the measurement since these act on the symmetrical sub-bridges to the same extent.

It is also known from EP 0607595 A2 for the Wheatstone bridge to have a variable resistor associated with it, which can be trimmed mechanically or by laser operation in order to adjust the symmetry of the overall configuration.

It is disadvantageous in the known circuit configuration that mounting tolerances of a sensor chip equipped with the circuit configuration with respect to the current-carrying conductor lead to varying magnitudes of the magnetic field strength in the area of sub-bridges which can no longer be compensated with opposing fields of identical magnitudes. Compensation of such mounting tolerances through trimming of the variable resistor is not possible or is subject to large measurement errors.

It is an object of the invention to create a circuit configuration for a gradiometric current sensor and a current sensor in which mounting tolerances can be compensated in a simple manner.

This object is achieved according to the invention by a circuit configuration with the features stated in claim 1. Owing to the fact that the sub-bridges of the Wheatstone bridge, which are arranged symmetrically to the sub-conductors of the current-carrying conductor, can each have a separate compensating current applied to them, compensation in a simple manner becomes possible of, in particular, magnetic fields of varying strengths brought about by mounting tolerances in the area of sub-bridges. During a calibration routine, the ratio of the then separate compensating currents can be adjusted in such a way that it corresponds to the ratio of the magnetic field strengths generated by the current to be measured in the area of the sub-bridges. The mean or the total compensating current from the two sub-compensating currents is then a precise measure of the current to be measured. The compensation of mounting tolerances or component tolerances is thereby possible to a precise degree by electronic means so that trimming of a compensating resistor can be dispensed with. The omission of the compensating resistor also makes the entire circuit configuration simpler in structure and thereby more favorably priced.

Preferred embodiments of the invention derive from the features specified in the dependent claims.

The invention will be described in more detail below with reference to an embodiment shown in the drawing, diagrammatically showing a sensor chip with a circuit configuration for gradiometric current measurement.

The FIGURE shows a sensor chip referenced 100 in its totality and comprising a circuit configuration 12. The circuit configuration 12 is equipped with a bridge circuit in the form of a Wheatstone bridge. The Wheatstone bridge is equipped with four magnetoresistive resistors 14, 16, 18 and 20. The resistors 14 and 16 here form a first sub-bridge 22, and the resistors 18 and 20 form a second sub-bridge. The bridge circuit can have a supply voltage $V_{CC}$ applied to it in known manner, and an output voltage $V_{OUT}$ can be tapped as the output signal. The structure and operating mode of bridge circuits of this kind are generally known, so these will not be further described in the context of the present invention. The magnetoresistive resistors 14, 16, 18 and 20 are here equipped with indicated barber pole structures 26, which ensure that only one adjacent field gradient drives the bridge circuit.

The sub-bridges 22 and 24 are arranged symmetrically in relation to respective sub-conductors 28 and 30 of a current-carrying conductor 32. The conductor 32 carries a current $I_{mess}$ which is to be determined by sensor chip 100. The sensor chip 100 is arranged on a base 34 so that the circuit configuration 12 is isolated from the electrical conductor 32.

The circuit configuration 12 further comprises a compensating circuit 36. The compensating circuit 36 comprises compensating conductors 38 and 38' which are arranged below the magnetoresistive resistors 14, 16, 18 and 20 and electrically insulated from these, such that the compensating conductor 38 is associated with the resistors 14 and 16, and the compensating conductor 38' is associated with the resistors 18 and 20. The compensating conductor 38 is connected to an input terminal 40 at one end and to a fixed voltage potential GND at the other end. The compensating conductor 38' is connected to an input terminal 42 and, likewise, to the fixed voltage potential GND. It is clear that the compensating circuit 36 is thereby divided into separate compensating loops, each associated with the respective bridge arm 22, 24.

The circuit configuration 12 shown in the FIGURE has the following function:

The conductor 32, and thus the sub-conductors 28 and 30, carry the current to be measured $I_{mess}$. This gives rise to a magnetic-field gradient which is proportional to the current to be measured $I_{mess}$. The magnetic fields are measured by the sub-bridges 22 and 24. Under the influence of the operative magnetic field, at least one of the magnetoresistive resistors changes its resistance value so that, with a constant input voltage $V_{CC}$, the output voltage $V_{OUT}$ of the Wheatstone bridge changes. The output voltage $V_{OUT}$ is fed to an evaluation circuit via which the compensating circuits $I_{comp1}$ and $I_{comp2}$ can be generated. This evaluation circuit will now generate compensating currents $I_{comp1}$ and/or $I_{comp2}$ in such a way that the output voltage $V_{OUT}$ of the Wheatstone bridge goes to zero. The magnitude of the compensating currents $I_{comp}$ is thus a measure of the magnetic-field gradients and thus of the magnitude of the current to be measured $I_{mess}$.

The separation of the compensating currents into compensating arms 38 and 38' makes two compensating currents $I_{comp1}$ and $I_{comp2}$ available, the ratio of which is adjusted by the evaluation circuit such that it corresponds to the ratio of the magnetic field strengths generated by the current $I_{mess}$ in the areas of the respective associated sub-bridges 22 and 24. The mean or total compensating current deriving from the compensating currents $I_{comp1}$ and $I_{comp2}$ is then an extremely accurate measure of the current to be measured $I_{mess}$. The division into two compensating arms 38 and 38' achieves that production tolerances and/or mounting tolerances are taken into account in the compensation.

A compensating gradiometric current measurement is achieved thereby in a simple manner. Sensor chip 100 is characterized by a small structure, necessitating the involvement of only few components. The compensation gives rise to an insensitivity to homogeneous external magnetic fields. Furthermore, mounting tolerances, ageing-related tolerances, component tolerances, or the like can be compensated in a simple manner. Finally, owing to the identical offset of both compensating currents $I_{comp1}$ and $I_{comp2}$, the offset of the Wheatstone bridge overall can be electronically compensated. Likewise, trimming of the Wheatstone bridge for compensation of offsets of this kind is no longer necessary.

REFERENCE LIST

100 Sensor chip
12 Circuit configuration
14, 16, 18, 20 Resistors
22 First sub-bridge
24 Second sub-bridge
26 Barber pole structures
28, 30 Sub-conductor
32 Conductor
34 Base
36 Compensating circuit
38, 38' Compensating conductor
40 Input terminal
42 Input terminal
$V_{CC}$ Supply voltage
$V_{OUT}$ Output voltage
$I_{comp1}$ Compensating current
$I_{comp2}$ Compensating current
$I_{mess}$ Current
GND Voltage potential

The invention claimed is:

1. A circuit configuration for a gradiometric current sensor with a bridge circuit in the form of a Wheatstone bridge for measuring gradients of the magnetic field strength of a current-carrying conductor, with four magnetoresistive resistors, two of which resistors form a sub-bridge in each case, whereby the sub-bridges are arranged symmetrically in relation to sub-conductors of the current-carrying conductor, and with a compensating circuit associated with the bridge circuit, which compensating circuit comprises compensating conductors associated with the magnetoresistive resistors, to which compensating conductors a current can be applied, characterized in that the sub-bridges (22, 24) can each have a separate current ($I_{comp1}$, $I_{comp2}$) applied to them.

2. A circuit configuration as claimed in claim 1, characterized in that the compensating circuit (36) comprises separately switched compensating conductors (38, 38'), which are associated with resistors (14, 16) and with the resistors (18, 20), respectively.

3. A circuit configuration as claimed in claim 1, characterized in that the compensating conductor (38) is connected to an input terminal (40) and to a fixed voltage potential (GND), and the compensating conductor (38') is connected to an input terminal (42) and the fixed voltage potential (GND).

4. A circuit configuration as claimed in claim 1, characterized in that the separate currents ($I_{comp1}$, $I_{comp2}$) can be applied to the input terminals (40, 42) as a function of the output voltage ($V_{OUT}$) of the bridge circuit.

* * * * *